US009373719B2

(12) United States Patent
Hong et al.

(10) Patent No.: US 9,373,719 B2
(45) Date of Patent: Jun. 21, 2016

(54) SEMICONDUCTOR DEVICE

(71) Applicant: UNITED MICROELECTRONICS CORP., Hsinchu (TW)

(72) Inventors: Shih-Fang Hong, Tainan (TW); Chung-Yi Chiu, Tainan (TW)

(73) Assignee: UNITED MICROELECTRONICS CORP., Hsinchu (TW)

( * ) Notice: Subject to any disclaimer, the term of this patent is extended or adjusted under 35 U.S.C. 154(b) by 0 days.

(21) Appl. No.: 14/027,334

(22) Filed: Sep. 16, 2013

(65) Prior Publication Data

US 2015/0076569 A1    Mar. 19, 2015

(51) Int. Cl.
*H01L 29/78* (2006.01)
*H01L 29/66* (2006.01)

(52) U.S. Cl.
CPC .......... *H01L 29/785* (2013.01); *H01L 29/6681* (2013.01)

(58) Field of Classification Search
CPC ............ H01L 29/6659; H01L 29/7833; H01L 29/665; H01L 29/6656; H01L 21/823807; H01L 29/785; H01L 29/78
USPC .......... 257/288, 347, 365–369, 391, 397, 401
See application file for complete search history.

(56) References Cited

U.S. PATENT DOCUMENTS

| | | | |
|---|---|---|---|
| 6,043,138 A | 3/2000 | Ibok | |
| 6,492,216 B1 | 12/2002 | Yeo | |
| 6,921,963 B2 | 7/2005 | Krivokapic | |
| 7,087,477 B2 | 8/2006 | Fried | |
| 7,091,551 B1 | 8/2006 | Anderson | |
| 7,247,887 B2 | 7/2007 | King | |
| 7,250,658 B2 | 7/2007 | Doris | |
| 7,309,626 B2 | 12/2007 | Ieong | |
| 7,352,034 B2 | 4/2008 | Booth, Jr. | |
| 7,470,570 B2 | 12/2008 | Beintner | |
| 7,531,437 B2 | 5/2009 | Brask | |
| 7,569,857 B2 | 8/2009 | Shaheen et al. | |
| 7,919,364 B2 * | 4/2011 | Sonsky | H01L 29/785 257/213 |
| 2004/0195624 A1 | 10/2004 | Liu | |
| 2005/0051825 A1 | 3/2005 | Fujiwara | |
| 2006/0099830 A1 | 5/2006 | Walther | |
| 2006/0286729 A1 | 12/2006 | Kavalieros | |
| 2007/0108528 A1 | 5/2007 | Anderson | |
| 2007/0158756 A1 | 7/2007 | Dreeskornfeld | |
| 2008/0157208 A1 | 7/2008 | Fischer | |
| 2009/0050975 A1 | 2/2009 | Bryant | |
| 2009/0124097 A1 | 5/2009 | Cheng | |
| 2009/0242964 A1 | 10/2009 | Akil | |
| 2009/0269916 A1 | 10/2009 | Kang | |
| 2010/0048027 A1 | 2/2010 | Cheng | |
| 2010/0072553 A1 | 3/2010 | Xu | |
| 2010/0144121 A1 | 6/2010 | Chang | |
| 2010/0167506 A1 | 7/2010 | Lin | |
| 2011/0095378 A1 * | 4/2011 | Lee | H01L 29/41791 257/401 |
| 2013/0277760 A1 * | 10/2013 | Lu | H01L 29/10 257/401 |
| 2014/0077303 A1 * | 3/2014 | Baek | G06F 17/5063 257/365 |

* cited by examiner

*Primary Examiner* — Monica D Harrison
(74) *Attorney, Agent, or Firm* — WPAT, PC; Justin King

(57) ABSTRACT

A semiconductor device is provided. The semiconductor device includes an active fin region, at least a gate strip, and a dummy fin region. The active fin region comprises at least an active fin. The gate strip is formed on the active fin region and extending across the active fin. The dummy fin region, comprising a plurality of dummy fins, is formed on two sides of the active fin region, and the dummy fins are formed on two sides of the gate strip.

12 Claims, 7 Drawing Sheets

SEMICONDUCTOR DEVICE

BACKGROUND

1. Technical Field

The disclosure relates in general to a semiconductor device, and more particularly to a semiconductor device with a dummy fin region.

2. Description of the Related Art

As the sizes of integrated circuits scale down, requirements for transistors having higher drive currents with smaller dimensions are increased. Thus, fin field-effect (finFET) transistors are developed. The channels of the finFETs are formed on the sidewalls and the top surfaces of the fins; accordingly, the finFETs have greater channel widths, which increase drive currents of the transistors. Therefore, as the applications of the finFETs increase, it is desirable to develop improved finFET structures with excellent performance.

SUMMARY OF THE INVENTION

The disclosure is directed to a semiconductor device. In the embodiments, dummy fins are formed on two sides of the active fin region in the semiconductor device, such that the active fin region can be protected from etching damage in the manufacturing process, and thus a better edge profile of the active fin region is provided.

According to an embodiment of the present disclosure, a semiconductor device is disclosed. The semiconductor device includes an active fin region, at least a gate strip, and a dummy fin region. The active fin region comprises at least an active fin. The gate strip is formed on the active fin region and extending across the active fin. The dummy fin region, comprising a plurality of dummy fins, is formed on two sides of the active fin region, and the dummy fins are formed on two sides of the gate strip.

The disclosure will become apparent from the following detailed description of the preferred but non-limiting embodiments. The following description is made with reference to the accompanying drawings.

DETAILED DESCRIPTION OF THE INVENTION

Figure 1A:
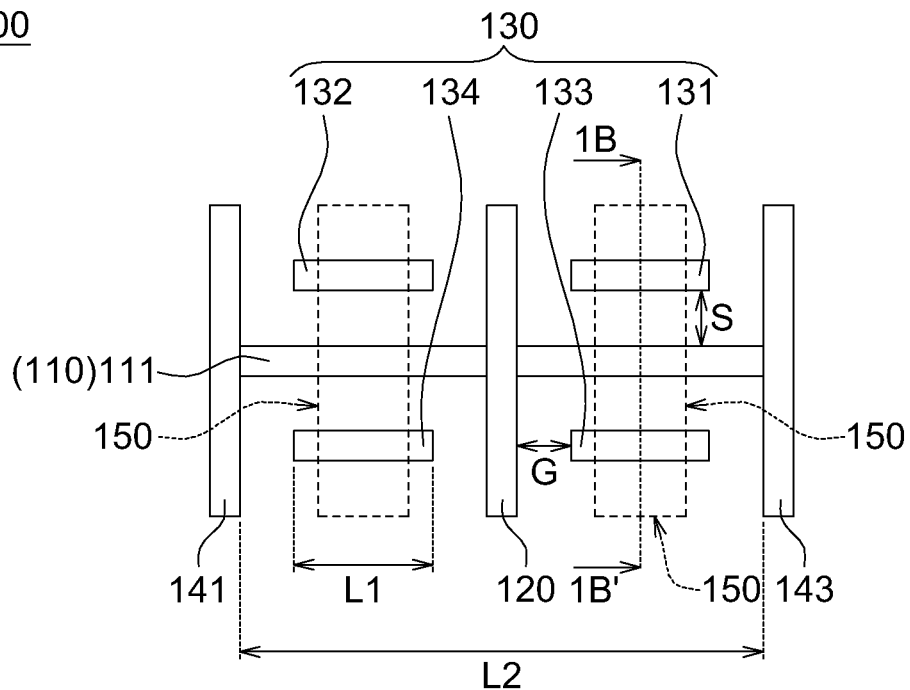
FIG. 1A shows a top view of a semiconductor device according to an embodiment of the disclosure.

In the embodiments, dummy fins are formed on two sides of the active fin region in the semiconductor device, such that the active fin region can be protected from etching damage in the manufacturing process, and thus a better edge profile of the active fin region is provided. The embodiments are described in details with reference to the accompanying drawings. The procedures and details of the method of the embodiments are for exemplification only, not for limiting the scope of protection of the disclosure. Moreover, the identical elements of the embodiments are designated with the same reference numerals. Also, it is also important to point out that the illustrations may not be necessarily be drawn to scale, and that there may be other embodiments of the present disclosure which are not specifically illustrated. Thus, the specification and the drawings are to be regard as an illustrative sense rather than a restrictive sense.

Referring to FIG. 1A, a top view of a semiconductor device 100 according to an embodiment of the disclosure is shown. The semiconductor device 10 comprises an active fin region 110, at least a gate strip 120, and a dummy fin region 130. As shown in FIG. 1A, the active fin region 110 comprises at least an active fin 111, and the gate strip 120 is formed on the active fin region 110 and extending across the active fin 111. The dummy fin region 130, which comprises a plurality of dummy fins 131, 132, 133, 134, are formed on two sides of the active fin region 110, and the dummy fins 131-134 are formed on two sides of the gate strip 120. That is, the dummy fins 131-134 are located on the periphery region of the whole structure of the semiconductor device 100. As such, the dummy fins 131-134 located on two sides (periphery region) of the active fin 111 can protect the active fin 111 from etching damage in the manufacturing processes, and thus a better edge profile of the active fin 111 is provided.

For example, as shown in FIG. 1A, the dummy fins 131, 132 are formed on one side of the gate strip 120, and the dummy fins 133, 134 are formed on the opposite side of the gate strip 120. In addition, the gate strip 120 does not extend across any of the dummy fins 131-134.

As shown in FIG. 1A, in the present embodiment, the dummy fins 131-134 are provided with striped-shaped. However, the shape of the dummy fins may vary depending on the situations applied, and are not limited to the shapes as shown above.

In the present embodiment, the semiconductor device 100 may be a finFET device.

As shown in FIG. 1A, in the embodiment, the dummy fins 131-134 are parallel to the active fin 111. Moreover, the length L1 of the dummy fins 131-134 is smaller than the length L2 of the active fin 111.

Figure 1B:
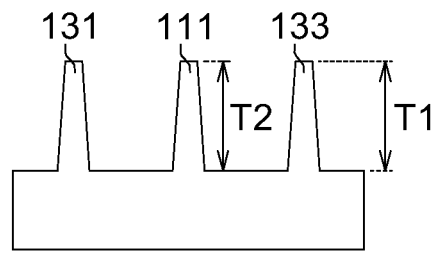
FIG. 1B shows a cross-sectional view of the dummy fins and the active fin along the cross-sectional line 1B-1B' of FIG. 1A.

Referring to FIG. 1B, a cross-sectional view of the dummy fins 131, 133 and the active fin 111 along the cross-sectional line 1B-1B' of FIG. 1A is shown. In the embodiment, the thickness T1 of the dummy fins 131, 133 is the same as the thickness T2 of the active fin 111. In an embodiment, as shown in FIG. 1B, the cross-section of a fin is such as tapered-shaped.

In the embodiment, as shown in FIG. 1A, the dummy fins 131-134 are separated from the gate strip 120 by a gap G, and the gap G is equal to or larger than 5 nm. Preferably, the gap G is equal to or larger than 10 nm. As such, no electrical interference, such as capacitance, occurs between the gate strip 120 and the dummy fins.

Moreover, the active fin region 110 and the dummy fin region 130 are separated by a spacing S, for example, the active fin 111 and the dummy fins 131-134 are separated by the spacing S, and the spacing S is about 35-45 nm.

As shown in FIG. 1A, the semiconductor device 100 may further comprise two dummy gate strips 141, 143. The two dummy gate strips 141, 143 cover the two opposite ends of the active fin region 110. The two dummy gate strips 141, 143 are not applied with any voltage. For example, the dummy gate strip 141 covers an end of the active fin 111, and the dummy gate strip 143 covers an opposite end of the active fin 111.

In the present embodiment, as shown in FIG. 1A, the semiconductor device 100 may further comprise an epi layer 150 formed on the active fin 111 and the dummy fins 131-134. In addition, the semiconductor device 100 may further comprise a silicide layer (not shown in FIG. 1A) formed on the epi layer 150. That is, the silicide layer is formed on the active fin 111 and the dummy fins 131-134 as well. It is noted that the epi layer 150 is drawn with dashed lines in the top view figure for further elaborating the present disclosure.

In the embodiments, the semiconductor device 100 may be a finFET device, and the epi layer 150 in combination with the silicide layer serves as an S/D (source/drain) region of the finFET device. The epi layer 150 along with the silicide layer formed on both the dummy fins and the active fin generates a more uniform profile of the S/D region, which results in a more uniform current distribution, and the resistance of the S/D region is reduced.

Figure 2A:
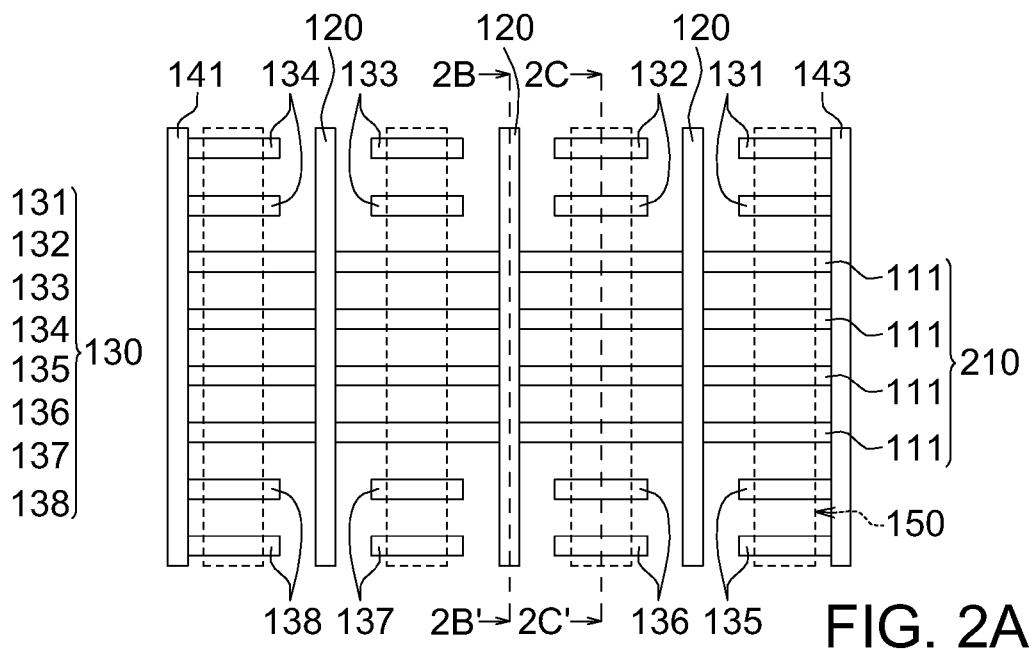
FIG. 2A shows a top view of a semiconductor device according to another embodiment of the disclosure.

Referring to FIG. 2A, a top view of a semiconductor device 200 according to another embodiment of the disclosure is shown. The semiconductor device 200 of the present embodiment is different from the semiconductor device 100 of the previous embodiment in the details of the active fin region 210 and the dummy fin region 230, and the similarities are not repeated here.

The semiconductor device 200 comprises an active fin region 210, a plurality of the gate strips 120, and a dummy fin region 230. As shown in FIG. 2A, the active fin region 210 comprises a plurality of the active fins 111, and the gate strips 120 are formed on the active fin region 210 and extending across the active fins 111. In the present embodiment, as shown in FIG. 2A, the gate strips 120 are arranged in parallel, and the active fins 111 are arranged in parallel. In the present embodiment, four active fins 111, three gate strips 120, and sixteen dummy fins 131-138 are shown. However, the numbers of the active fins 111, the gate strips 120, and the dummy fins may vary depending on the situations applied and are not limited to the numbers aforementioned. For example, when more active fins are applied, a higher current can be supplied.

In the present embodiment, as shown in FIG. 2A, The dummy fin region 230 comprises a plurality of dummy fins 131, 132, 133, 134, 135, 136, 137, 138, and the dummy fins 131-134 are formed on two sides of the active fin region 210. That is, the dummy fins are located on the periphery region of the whole structure, and the dummy fins are not formed between any two of the active fins 111. Furthermore, the dummy fins 131-138 are formed on two sides of the gate strips 120. For example, the dummy fins 131, 135 and the dummy fins 132, 136 are formed on two opposite sides of one of the gate strips 120. In the embodiment, as shown in FIG. 2A, at least two the dummy fins 131-138 are arranged between every two of the gate strips 120.

Figure 2B:
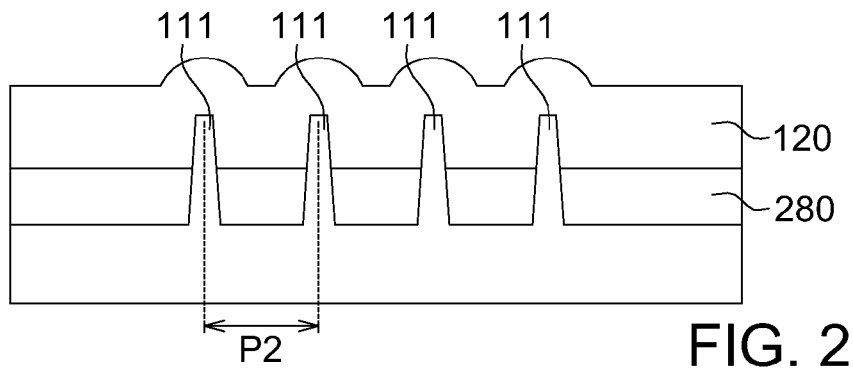
FIG. 2B shows a cross-sectional view of the semiconductor device along the cross-sectional line 2B-2B' of FIG. 2A.
Figure 2C:
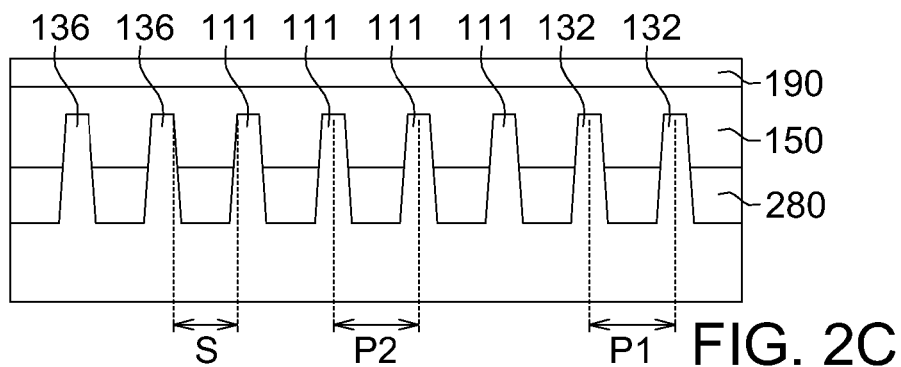
FIG. 2C shows a cross-sectional view of the semiconductor device along the cross-sectional line 2C-2C' of FIG. 2A.

Referring to FIGS. 2B-2C, FIG. 2B shows a cross-sectional view of the semiconductor device 200 along the cross-sectional line 2B-2B' of FIG. 2A, and FIG. 2C shows a cross-sectional view of the semiconductor device 200 along the cross-sectional line 2C-2C' of FIG. 2A.

In the embodiments, the pitch of the dummy fins and the pitch of the active fins are the minimum pitch that the manufacturing process allows. The pitch of the dummy fins and the pitch of the active fins may be the same or different from each other. In a preferred embodiment, the pitch of the dummy fins and the pitch of the active fins are substantially the same or very close to each other.

For example, as shown in FIGS. 2B-2C, the pitch P1 of the dummy fins 132, 136 and the pitch P2 of the active fins 111 are independently about 38-60 nm. Preferably, the pitch P1 of the dummy fins 132, 136 and the pitch P2 of the active fins 111 are independently about 42-50 nm. Moreover, in an embodiment, the pitch of the active fins and the pitch of the dummy fins are substantially the same. For example, as shown in FIGS. 2B-2C, the pitch P1 of the dummy fins 132, 136 and the pitch P2 of the active fins 111 are substantially the same. In the present embodiment, the pitch of the active fins 111 and the pitch of all of the dummy fins 131-138 may be substantially the same.

Moreover, the pitch of the active fins and the pitch of the dummy fins may be equal to or smaller than the spacing S between the active fin region and the dummy fin region. While the spacing S is larger than the pitches of the active fins and the dummy fins, such relaxed design rule provides a higher flexibility for the manufacturing processes of the active fin region and the dummy fin region, regardless the layout patterns of the two regions are drawn in a single step or separately. On the other hand, while the spacing S is equal to the pitches of the active fins and the dummy fins, the formation of the active fins and the dummy fins can be completed in a single manufacturing process, such that the manufacturing process of the semiconductor device 200 is simplified.

Additionally, as shown in FIG. 2B, the semiconductor device 200 may further comprise a STI oxide 280.

In the present embodiment, as shown in FIG. 2A, the semiconductor device 200 may further comprise an epi layer 150 formed on the active fins 111 and connecting the active fins 111. As shown in FIGS. 2A and 2C, the epi layer 150 may be further formed on the dummy fins 131-138. In an alternative embodiment, the epi layer 150 may be formed on all of the active fins 111 and not formed on at least some of the dummy fins 131-138 (not shown). In addition, as shown in FIG. 2C, the semiconductor device 200 may further comprise a silicide layer 190 formed on the epi layer 150. That is, the silicide layer is formed on the active fins 111 as well. It is noted that the epi layer 150 is drawn with dashed lines in the top view figure (FIG. 2A) for further elaborating the present disclosure.

In the embodiments, the semiconductor device 200 may be a finFET device, and the epi layer 150 in combination with the silicide layer 190 serves as an S/D (source/drain) region of the finFET device. The epi layer 150 along with the silicide layer 190 formed on both the dummy fins and the active fins generates a more uniform profile of the S/D region, which results in a more uniform current distribution, and the resistance of the S/D region is reduced.

Referring to FIGS. 3A-7B, a manufacturing method of the semiconductor device 200 according to the embodiments of the present disclosure is illustrated.

Figure 3A:
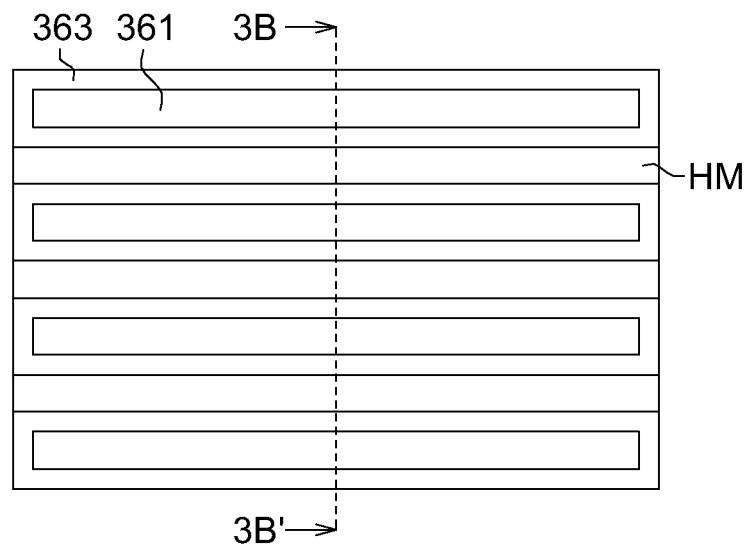
FIGS. 3A-7B illustrate a manufacturing method of the semiconductor device according to the embodiments of the present disclosure.
Figure 3B:
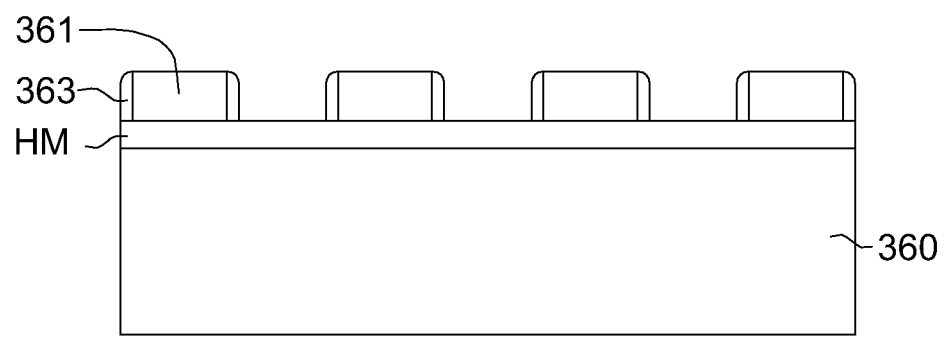

Referring to FIGS. 3A-3B (FIG. 3B is a cross-sectional view along the cross-sectional line 3B-3B' of FIG. 3A), a silicon substrate 360 is provided, a hard mask HM is formed on the silicon substrate 360, and a plurality of silicon strips 361 are formed on the hard mask HM. The material of the silicon strips 361 is such as polysilicon. Next, a nitride film is formed over the silicon strips 361 and the hard mask HM, followed by partially removing the nitride layer for forming the nitride spacer 363 and exposing the top surfaces of the silicon strips 361 In the present embodiment, the nitride layer may be partially removed by an etching process. As shown in FIGS. 3A-3B, the nitride spacer 363 surrounds the sidewalls of the silicon strips 361.

Figure 4A:
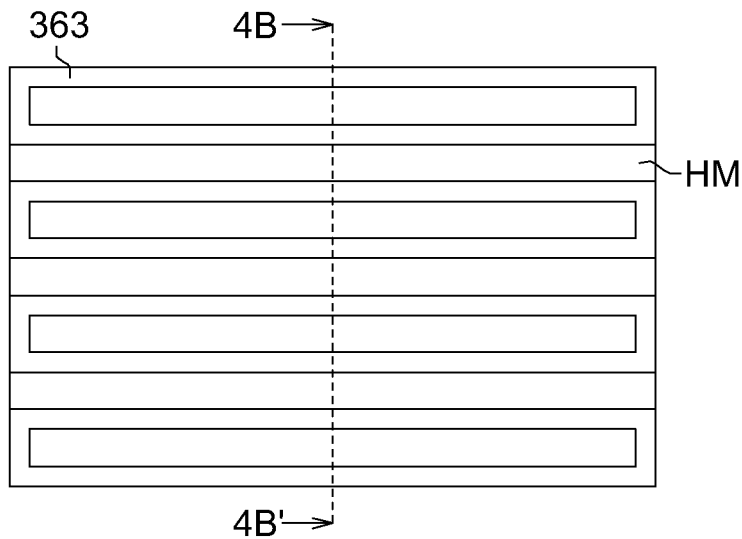
Figure 4B:
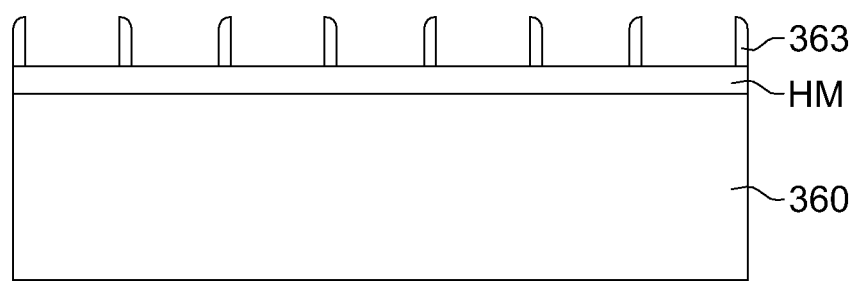

Next, referring to FIGS. 4A-4B (FIG. 4B is a cross-sectional view along the cross-sectional line 4B-4B' of FIG. 4A), the silicon strips 361 are removed. In the present embodiment, the silicon strips 361 are removed by such as a wet etching process or dry etching process.

Figure 5A:
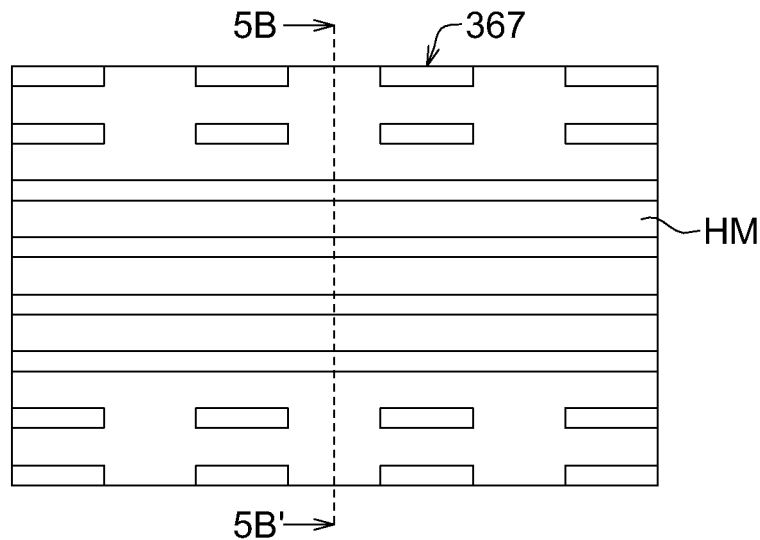
Figure 5B:
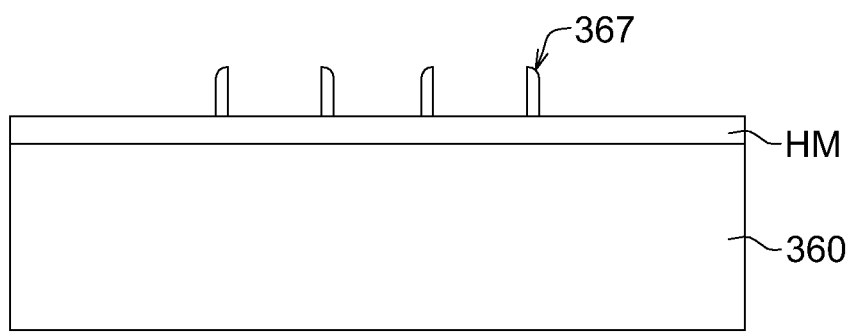

Next, referring to FIGS. 5A-5B (FIG. 5B is a cross-sectional view along the cross-sectional line 5B-5B' of FIG. 5A), the remaining nitride spacer 363 is further patterned for forming a patterned nitride layer 367. The pattern of the patterned nitride layer 367 corresponds to the transferred pattern of the active fin region and the dummy fin region. The patterning of the nitride spacer 363 is performed by such as a lithography etching process.

Figure 6A:
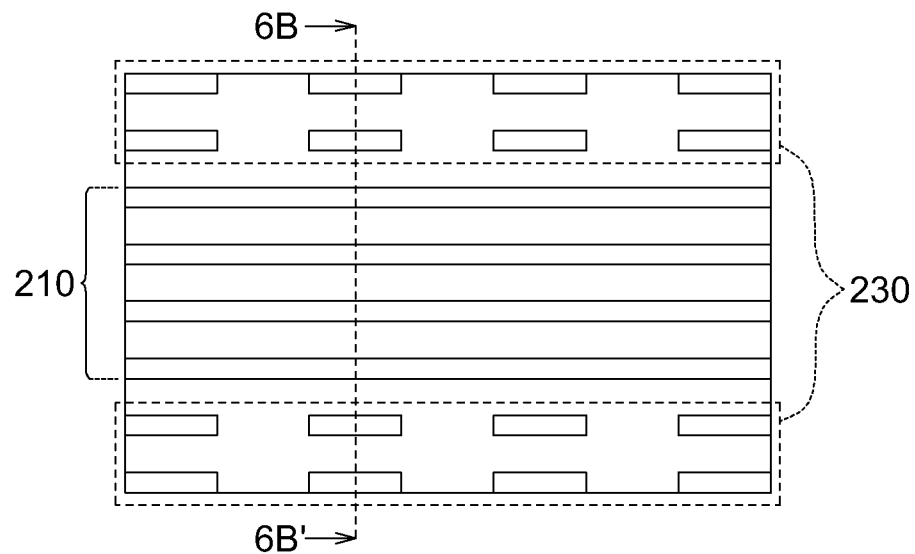
Figure 6B:
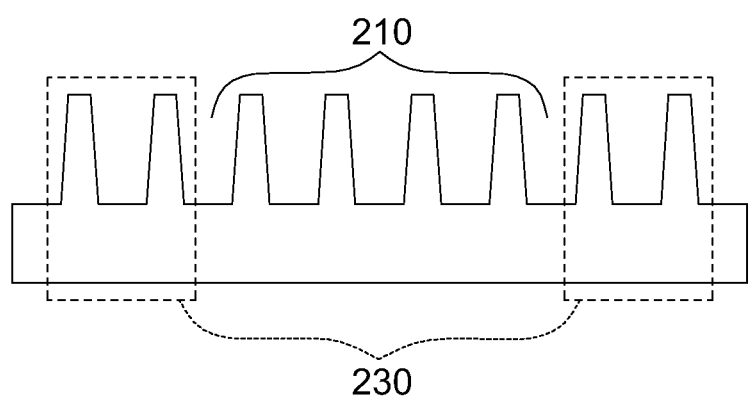

Next, referring to FIGS. 6A-6B (FIG. 6B is a cross-sectional view along the cross-sectional line 6B-6B' of FIG. 6A), the silicon substrate 360 is etched according to the patterned nitride layer 367 for forming the active fin region 210 and the dummy fin region 230.

Generally, when an etching process is performed to an object, the edge region of the object usually suffers from more etching, which causes etching damage to the edge region of the object; for example, the thickness or the height of the object on the edge region may be relatively low, or the etching profile of the edge region may be poor. In contrast, according to the embodiments of the present disclosure, as shown in FIG. 6A, the dummy fin region 230 is located on two sides of the active fin region 210; accordingly, the dummy fins become the edge region of the whole fin structure. As such, the active fins are located between and protected by the dummy fins from etching damage, the etch loading of the active fins located on the edge region of the active fin region is reduced, and thus a better edge profile of the active fins 111 is provided.

Figure 7A:
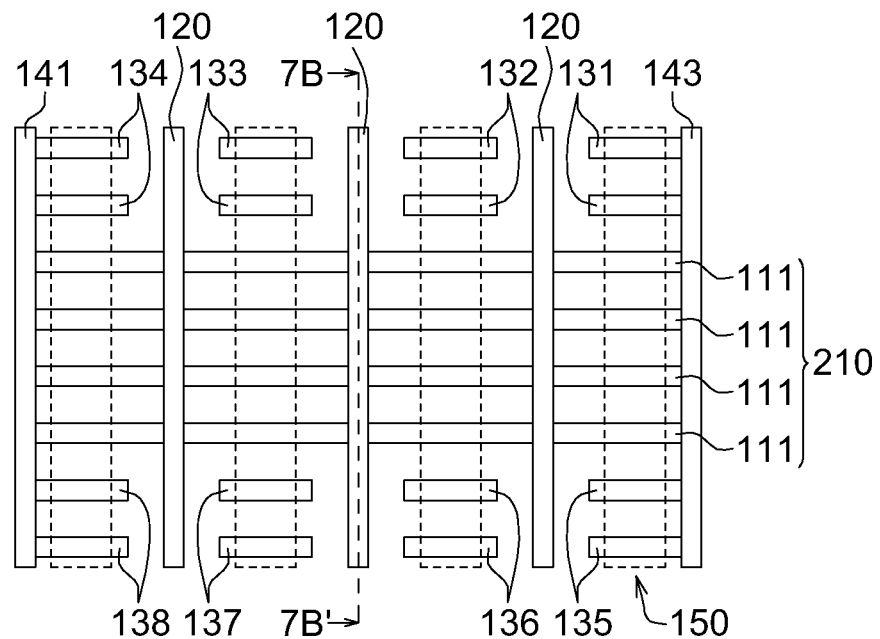
Figure 7B:
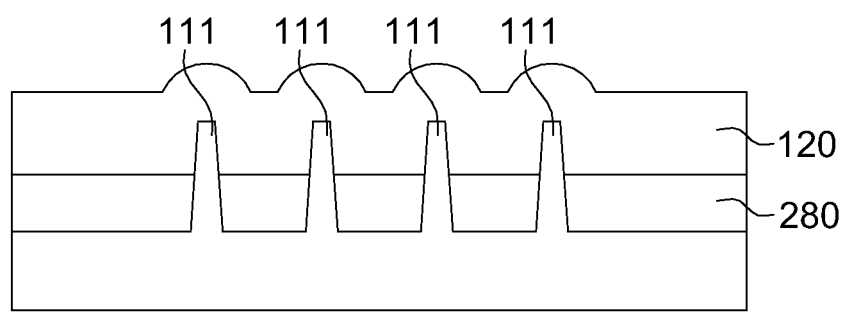

Referring to FIGS. 7A-7B (FIG. 7B is a cross-sectional view along the cross-sectional line 7B-7B' of FIG. 7A), the remained patterned nitride layer 367 and hard mask HM are removed, an oxide layer is formed on the active fin region 210 and the dummy fin region 230, an etching process is performed to the oxide layer for forming a STI oxide 280, and the dummy gate strips 141, 143 and the gate strips 120 are formed. In the present embodiment, the dummy gate strips 141, 143 and the gate strips 120 are formed in the trenches defined by the STI oxide 280. Likewise, the formation of the dummy gate strips 141, 143 on two sides of the gate strips 120 is advantageous to protecting the formation of the gate strips 120 from etching damage and providing a better profile of the gate strips 120. To be more specific, the formation of the trenches for the dummy gate strips 141, 143 is advantageous to protecting the trenches for the gate strips 120 from etching damage and reducing the etch loading thereof. As such, the semiconductor device 200 as shown in FIGS. 7A-7B (FIGS. 2A-2C) is formed.

While the invention has been described by way of example and in terms of the preferred embodiment(s), it is to be understood that the invention is not limited thereto. On the contrary, it is intended to cover various modifications and similar arrangements and procedures, and the scope of the appended claims therefore should be accorded the broadest interpretation so as to encompass all such modifications and similar arrangements and procedures.

What is claimed is:

1. A semiconductor device, comprising:
   an active fin region, comprising at least an active fin;
   at least a gate strip formed on the active fin region and extending across the active fin;
   a dummy fin region, comprising a plurality of dummy fins, formed on two sides of the active fin region, wherein each row of the dummy fins are disposed on a line perpendicular to the gate strip, the dummy fins are formed on two sides of the gate strip, the gate strip does not extend across any of the dummy fins, and the dummy fins are parallel to the active fin; and
   an epi layer formed on the active fin, wherein the epi layer is not formed on at least some of the dummy fins;
   wherein the active fin region and the dummy fin region are separated by a spacing of about 35-45 nm.

2. The semiconductor device according to claim 1, wherein the thickness of the dummy fins is the same as the thickness of the active fin.

3. The semiconductor device according to claim 1, wherein the length of dummy fins is smaller than the length of the active fin.

4. The semiconductor device according to claim 1, wherein the dummy fins are separated from the gate strip by a gap of equal to or larger than 5 nm.

5. The semiconductor device according to claim 1, further comprising:
   two dummy gate strips covering two opposite ends of the active fin region.

6. The semiconductor device according to claim 1, further comprising:
   a plurality of the gate strips which are arranged in parallel.

7. The semiconductor device according to claim 6, wherein at least two of the dummy fins are arranged between every two of the gate strips.

8. The semiconductor device according to claim 1, wherein the active fin region further comprises a plurality of the active fins arranged in parallel.

9. The semiconductor device according to claim 8, wherein the pitch of the active fins and the pitch of the dummy fins are independently about 38-60 nm.

10. The semiconductor device according to claim 8, wherein the pitch of the active fins and the pitch of the dummy fins are independently about 42-50 nm.

11. The semiconductor device according to claim 8, wherein the pitch of the active fins and the pitch of the dummy fins are substantially the same.

12. The semiconductor device according to claim 1, further comprising:
   a silicide layer formed on the epi layer.

* * * * *